United States Patent [19]

Tzeng

[11] Patent Number: 4,678,716
[45] Date of Patent: Jul. 7, 1987

[54] ELECTROMAGNETIC SHIELDING

[75] Inventor: Wen-Shian V. Tzeng, Reading, Mass.

[73] Assignee: Chomerics, Inc., Woburn, Mass.

[21] Appl. No.: 762,962

[22] Filed: Aug. 6, 1985

[51] Int. Cl.⁴ ............................................. R22F 3/00
[52] U.S. Cl. ............................... 428/551; 174/35 GC;
174/35 MS; 252/513; 252/514; 428/641;
428/646; 428/647; 428/648; 428/650; 428/651;
428/652; 523/137
[58] Field of Search ................... 174/35 GC, 35 MS;
252/513, 514; 428/641, 650, 651, 652, 646, 647,
648, 551; 523/137

[56] References Cited

U.S. PATENT DOCUMENTS

| | | | |
|---|---|---|---|
| 4,076,652 | 2/1978 | Ganci et al. | 252/511 |
| 4,126,287 | 11/1978 | Mendelsohn | 174/35 MS |
| 4,174,419 | 11/1979 | Nienart | 428/900 |
| 4,189,618 | 2/1980 | Brett et al. | 174/35 MS |
| 4,316,944 | 2/1982 | Landsman | 252/514 |
| 4,434,541 | 3/1984 | Powers | 29/600 |
| 4,442,182 | 4/1984 | Chart | 428/654 |
| 4,507,359 | 3/1985 | Powers | 174/35 MS |
| 4,587,039 | 5/1986 | Yamaoka et al. | 252/511 |

Primary Examiner—Stephen J. Lechert, Jr.
Attorney, Agent, or Firm—Wolf, Greenfield & Sacks

[57] ABSTRACT

Aluminum silicon alloys are used as cores for highly conductive metal coated particles to be incorporated in resins for use as electromagnetic interference shielding. High temperature processing conditions are used after coating of the particles to improve internal and external corrosion resistance of gaskets and filled resins into which the particles are incorporated for shielding use.

18 Claims, 8 Drawing Figures

ELECTROMAGNETIC SHIELDING

BACKGROUND OF THE INVENTION

Electromagnetic interference (EMI) shielding materials are well known in the art in forms such as gaskets, caulking compounds, adhesives, coatings and the like for a variety of EMI shielding purposes.

In the past, Where high shielding performance is necessary, EMI shielding has tended to use silver particles or silver coated copper particles dispersed in a resin binder. More recently, aluminum core silver coated particles as said forth in U.S. Pat. No. 4,507,359 have been used to reduce costs while maintaining good electrical and physical properties.

Prior art particles have often exhibited disadvantages which include one or more of, limited high-temperature functioning without loss of electrical conductivity, corrosion of particles internally or externally of gaskets, or in the case of silver coated glass particles, limited current carrying capacity in cases where electromagnetic pulse conditions are encountered.

Other U.S. patents showing the state of the art include U.S. Pat. Nos. 3,140,342; 3,194,860; 3,202,488; 3,476,530; 3,583,930 and 4,434,541; as well as published Hungarian Pat. Document No. 166,727 (referred to in Chemical Abstract No. 159606S).

The present inventions provides an EMI shielding material which avoids high cost of pure silver particles while providing good EMI shielding effectiveness. The present particles when incorporated in shielding, form end structures which provide desirable features in shielding and are even more effective in corrosion resistance than previous particles including the substantially improved relatively recently developed aluminum core precious metal coated particles of the prior art. Maintaining low resistance or impedance across an EMI joint over the life of an electronic enclosure is critical for shielding. Corrosion of the conductive particles (internal corrosion) or of the flange material at the joint with a shield such as a gasket (external corrosion) can be a substantial problem. The particles of the invention in addition to increased corrosion resistance, maintain advantages of such prior art aluminum core particles which include reduction in weight and cost which are particularly significant in certain applications including areospace applications.

BRIEF SUMMARY OF THE DISCLOSURE

It is an object of this invention to provide electrically conductive particles for use as a conductive filler in a resin matrix for electromagnetic shielding use which particles provide high corrosion resistance internally and externally of the resin matrix with desirable shielding properties.

Still another object of this invention is to provide an EMI shielding material having a volume resistivity effective as an electromagnetic shield which has high corrosion resistance and desirable electrically conductive properties resulting in good shielding properties.

Still another object of this invention is to provide methods of forming electrically conductive particles for use as conductive fillers in resin matrices for electromagnetic shielding uses which particles are heat treated by efficient and effective methods to increase corrosion resistance properties of final products.

According to the invention electrically conductive particles for use as a conductive filler in a resin matrix for electromagnetic shielding use comprise an inner core of an aluminum silicon alloy having from about 5 percent to about 20 percent by weight of silicon and an intermediate layer of metal selected from the group consisting of mercury, platinum, copper, chromium, platinum, gold, nickel, tin and zinc or alloys and mixtures thereof with an outer layer of a highly electrically conductive metal which is preferable a noble metal and more preferably silver although other metals such as nickel can be used.

According to a method of this invention electrically conductive particles are formed for use as a conductive filler in a resin matrix for electromagnetic shielding use by heat treating an aluminum alloy core noble metal plated particle having an intermediate metallic layer under non-oxidizing conditions at high temperature preferably in the range of from 300° C. to 600° C. and preferably in a non-oxidizing gaseous atmosphere.

In an alternate method, the particles are treated at a temperature of from 300° C. to 600° C. at a vacuum condition of 1 Torr or less pressure.

The metal particles having the silver or other noble metal outer layer and produced in accordance with the invention can be incorporated in resin matrices as for example set forth in U.S. Pat. No. 4,507,359. The particles can be of any desired shape known in the art for filler particles to make electrically conductive materials. Thus, the particles can be substantially spherical, flat, non-spherical in the shape of rods or non-regular geometric shapes. The "resin" as used herein into which the particles can be incorporated can be any plastic or elastic materials including rubbers such as silicone, flurosilicone, polyisobutylene elastomers. Other plastics suitable for use as the resin include polyamides, acrylics, urethanes, polyvinyl chloride, silicone and others as conventionally used in gaskets, adhesives, caulking compounds and coatings into which the particles of this invention can be incorporated in known EMI shielding configurations and structures.

It is a feature of this invention that good electrically conductive properties and thus high shielding ability can be obtained in economical products capable of good production rates at reasonable costs. Outstanding internal and external corrosion resistant properties are obtained when the heat treating steps of this invention are used although substantially reasonable results are obtained with the particles even without the additional processing of the high temperature steps.

DETAILED DESCRIPTION OF PREFERRED EMBODIMENTS

Figure 1:
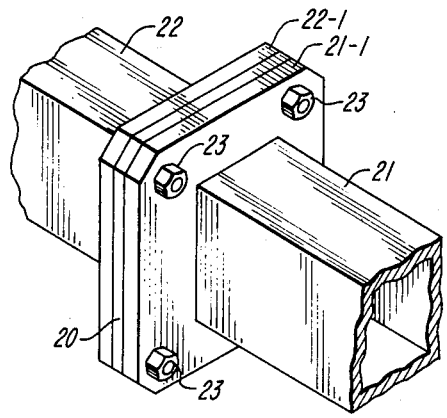
FIG. 1 is an isometric view of a compressible gasket according to this invention between two wave guide flanges.
Figure 2:
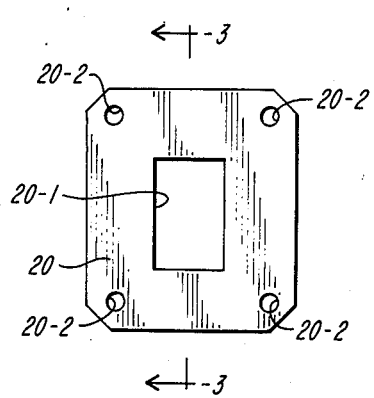
FIG. 2 is a front view of the gasket.
Figure 3:
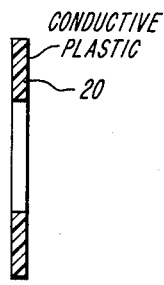
FIG. 3 is a sectional view of FIG. 2 taken along line 3—3.

Reference should now be had to FIGS. 1 to 3. In these FIGS. a die-cut form stable gasket 20 is placed between the flanges 21$^{-1}$ and 22$^{-1}$ of wave-guides 21 and 22 which are held together by bolts 23. The gasket 20 being of a compressible binder effectively seals the junction against moisture entering the wave-guides as well as preventing electromagnetic energy in the wave-guide from escaping as is known in the art. While the gasket may be cut from a sheet of material it should be appreciated that it may also be molded. The gasket 20 has a central opening for the electromagnetic energy to pass from one wave-guide section to another and holes 20-2 for passage of bolts 23.

Figure 4:
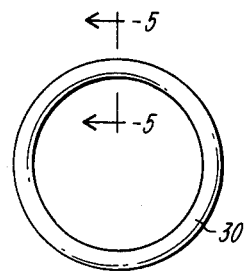
FIG. 4 is a front view of an O ring gasket.
Figure 5:
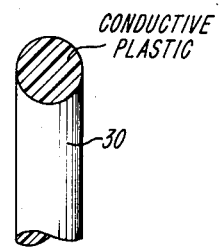
FIG. 5 is a sectional view of FIG. 4 taken along line 5—5.

In FIGS. 4 and 5 there is disclosed a molded O ring 30 as an electromagnetic energy shield. The O ring 30 is placed in grooves of two flanges such as 21$^{-1}$ and 22$^{-1}$ and pressure is applied to compress the O ring to achieve an effective seal.

Figure 6:
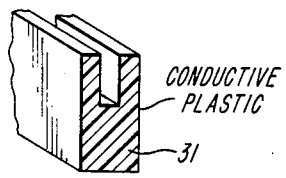
FIG. 6 is a sectional view of an extruded channel strip gasket.

FIG. 6 illustrates an extruded channel strip gasket 31 made of the shielding material disclosed herein.

It is clear from the above that gaskets (die-cut, extruded, molded) of many shapes can be made using the material of this disclosure and accordingly the invention herein should not be considered as limited to any particular shape.

In the present invention, the most preferred material for use as a conductive particle loaded gasket material comprises a silicone rubber binder filled with electrically conductive particles having an aluminum silicon core with a first coating of zinc having an overcoating of silver.

Other binders or resins which form the matrix material can include flurosilicone rubber and others mentioned previously in the specification. The material can be formed as sheets, molded articles, coatings, adhesives in all known structural forms depending upon the nature of the binder used and the specific application.

Conventional processing steps can be used to incorporate the metal particles into the resins along with conventional fillers known in the art.

While a zinc intermediate layer is preferred for use with the aluminum silicon core, other intermediate layers including the following: mercury, palladium, copper, chromium, platinum, gold, nickel, and tin, which can then be coated with a metal and preferably silver can be used.

EMI shielding material preferably comprises 80 to 50 percent by volume by resin or binder and 20 to 50 percent by volume of electrically conductive particles of this invention. The volume resistivity of the shielding material is preferably less than 0.1 and most preferably less than 0.01 ohm centimeter. Preferably the particle loading in the resin is from 30 to 42 percent by volume and even more preferably from 35 to 40 percent by volume. The particles preferably are made up of 1 to 5 percent by weight of the intermediate layer although they can have from 0.2 to 10 percent by weight of the intermediate layer with preferably from 4 to 25 percent by weight of the overall particle, of the outer layer which can be silver.

The particles when coated and completed can be in sizes as customarily in the art for EMI shielding purposes. Preferably the particles have 10 to 150 microns in average particles size and most preferably 20 to 75 microns in average particles size. The particles can have average particle sizes of from 1 to 300 microns or higher.

The silicon aluminum alloy preferably has from about 70 to about 95 percent by weight of aluminum and from about 5 to about 20 percent by weight of silicon with from about 9 to 14 percent by weight of silicon being preferred. Impurities and small or trace amounts of other metals comprising conventional aluminum alloying materials may be present in amounts up to about 10 percent by weight as known in the art.

The aluminum silicon alloy powder can be any aluminum silicon powder but is preferably an eutectic alloy. Powders such as commercial aluminum silicone eutectic alloys available from Alcoa, (Pittsburgh, Pa.) as grade 718, Reynolds Aluminum, (Richmond, Va.) as LS-A-887 and Valimet (Stockton, Calif.) (coarse and fine grade aluminum silicon powder) can be used. Such powders customarily range from 5 to 300 microns in particle size, with often from 5 to 15 percent silicon and a maximum of 5 percent of other elements.

It is preferred to use aluminum silicon powders which are atomized powders produced with inert gases to insure minimum oxide formation on the powder surface. As atomized, aluminum silicon powder of eutectic or near eutectic composition preferred for use in this invention, generally contain very fine dendritic and silicon rich percipitates throughout each particle. The morphology of the dentrites can be coarsened and spheroidized by heat treating the powder above 300° C. and preferably in the range of 300° C. to 600° C. When the structures are examined under a microscope using samples prepared by conventional metallographic polishing and etching techniques the dendritic structure can be seen.

Figure 7:
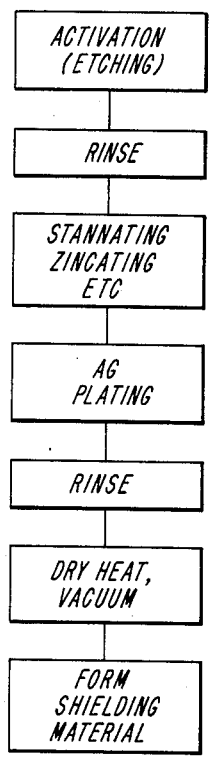
FIG. 7 is a diagrammatic drawing of steps in initially processing conductive particles in accordance with the present invention.

In the process of treating the aluminum silicon powder, as shown in FIG. 7, in a first activating step the powder is etched using a mild alkaline solution to create a silicon rich surface. Etching can be carried out with acid or base or in water (with heat) preferably at a ph of under 10. In each case the solution is exothermic even though no heat need be used with the acid or base treatment. The temperature is controlled to maintain the processed powders so as to prevent runaway reactions which could become violent; yet, allow removal of naturally formed oxide layers, in time periods of from 2 to 15 minutes or longer.

In a second step as illustrated in FIG. 7, a rinse with water or any washing solution is used without allowing the particles to dry.

Plating can then be carried out with the intermediate layer using known techniques as known in the art and as described in U.S. Pat. No. 4,507,359.

Standard formulae for treatment of bulk aluminum parts may be found in the 1978 Metal Finishing Guidebook Directory, 46th Annual Edition, pp 171-172, published by Metals and Plastics Publications, Inc. Hackensack, NJ, as follows:

| 1. | Sodium Hydroxide | 70 oz/gal | 524 g/l |
| --- | --- | --- | --- |
|    | Zinc Oxide       | 13 oz/gal | 97 g/l  |
| 2. | Sodium Hydroxide | 6.7 oz/gal | 50 g/l |
|    | Zinc Oxide       | 0.67 oz/gal | 5 g/l |
| 3. | Sodium Hydroxide | 16 oz/gal | 120 g/l |
|    | Zinc Oxide       | 2.7 oz/gal | 20 g/l |

Using aluminum silicon powder, the amount of sodium hydroxide present should be controlled since its reaction with aluminum silicon powder can be violent and exothermic. In order to keep the reaction under control with relatively fine aluminum silicon powders (ca 60 micron average particle size) one should preferably use a solution containing approximately 10 grams of sodium hydroxide and 1.5 grams of zinc oxide with 100 grams of aluminum silicon powder (Valimet (coarse grade)) in about 750 mil deionized water. Good results are obtained when the reaction mixture is stirred for one hour. The powder is allowed to settle and is rinsed five times. The sodium hydroxide zinc oxide treatment is then repeated and the powder rinsed five times. It has been found that a second zincate treatment is preferred with powder to achieve optimum properties after silver plating.

In order to sensitize the powder for silver plating, the zinc coated aluminum silicon powder is immersed in a dilute solution of a reducing agent. In theory, the reducing agent is absorbed on the powder surface and initiates silver plating at the adsorption sites. In practice a 100 gram sample of zincated powder is dispersed in approximately 750 ml of deionized water containing 37 percent formaldehyde and stirred fifteen minutes allowed to settle and is rinsed three or four times.

Silver plating is carried out by conventional methods. The sensitized powder is dispersed in a solution prepared by dissolving 30 grams of silver nitrate in 500 ml deionized water and adding approximately 50 ml of 28 percent ammonium hydroxide. To this dispersion, approximately 150 ml of 37 percent formaldehyde is added over 15 minutes. The silver plated powder, which is a light tan color, is washed and rinsed several times with water and then washed with acetone and oven dried. After the powder is dry, it is heat treated at 200° C. at a pressure of 1 Torr for three hours prior to use. Aluminum silicon powder coated with zinc and then silver plated in this manner is highly conductive.

Another metal which may be used to form a composite particle with aluminum silicon and silver is nickel. The aluminum silicon powder is immersion coated with nickel from an acid solution preferably containing chloride or fluoride ions which aid in removal of the oxide coating from the aluminum. The aforementioned 1978 Metal Finishing Guidebook and Directory (p. 484) describes an immersion process for deposition of nickel on aluminum using 11 grams per liter of nickel sulfate and 30 grams per liter of ammonium chloride used at a boil. It is found that doubling the nickel concentration gives improved silver plating characteristics to the aluminum silicon powder. Thus, in a typical experiment, 100 g of aluminum silicon powder is dispersed in 750 ml of deionized water containing 20 grams of nickel sulfate and 30 grams of ammonium chloride. The dispersion is heated to about 95° C. and stirred for one hour. The powder is allowed to settle and rinsed five times.

Sensitization for silver plating is carried out using methods conventional for nonconductors. First, the powder is dispersed in a solution containing 1 gram per liter stannous chloride and 4 grams per liter of 36 percent hydrochloric acid.

After five rinses, the powder was dispersed in a solution containing 0.2 g/l palladium chloride and 0.2 g/l 36 percent hydrochloric acid. After stirring fifteen minutes, the powder is allowed to settle and rinsed five times.

Plating is carries out by dispersing the powder in a solution prepared by dissolving 30 grams of silver nitrate in 500 ml deionized water and adding approximately 50 ml of 28 percent ammonium hydroxide. To this dispersion about 150 ml of 37 percent formaldehyde is added over 15 minutes. The powder is washed several times with water, rinsed with acetone and dried. The dry powder is heat treated for three hours at 200° C. at $10^{-2}$ Torr.

Tin can be displacement plated on aluminum silicon powder e.g., Valimet (coarse grade) using alkaline solutions of tin compounds. The aforementioned 1978 Metal Finishing Guidebook and Directory, page 484 discloses 6 oz/gal (45 g/l) sodium stannate at 125°-180° F. for plating tin on aluminum. With aluminum silicon powder lower concentrations of sodium stannate and lower temperatures should be used because of the extreme exothermic reaction. In practice 100 g of aluminum silicon powder is dispersed in 700 ml of water and a solution of 13 grams of sodium stannate is added over 30 minutes.

The mixture is stirred for one hour and allowed to settle and is rinsed five times. The stannate treatment is repeated and the powder is dried. Sensitizing and silver plating are carried out as with zinc.

It should be understood that other known methods may also be used to effect plating of aluminum silicon.

Note FIG. 7 shows the intermediate layer coating as stannating or zinc coating with silver plating as discussed.

After silver plated the particles are rinsed with water or other rinsing solutions, dried and sifted in accordance with known techniques.

The silver plated aluminum silicon core materials are preferably vacuum heat treated for from 2 to about 8 hours preferably at temperatures of from 150° C. to 300° C. and preferably about 200° C. and at pressures less than 1 Torr and preferably of from $10^{-1}$ to $10^{-2}$ Torr. This step is a drying step and the temperature, times and vacuum conditions can vary greatly depending on what may be desired to obtain clean dry particles which can be incorporated in resin for shielding use, or first heat treated in accordance with a method of FIG. 8.

The particles or other metal coated particles made by conventional methods for shielding can then be put in gasket, adhesive or other application materials in accordance with known techniques and are found to have substantial shielding internal and external corrosion resistance and other desirable properties. However, more desirable properties with respect to external corrosion resistance can be obtained by heat treatment of the particles in accordance with the diagrammatic showing of FIG. 8.

Figure 8:
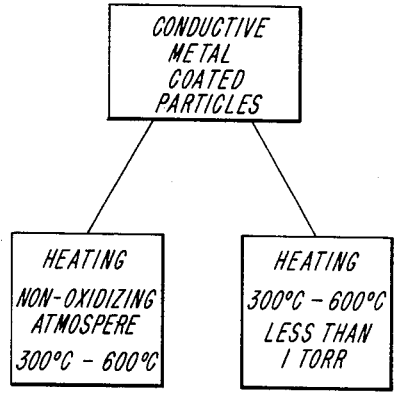
FIG. 8 is a diagrammatic showing of additional steps for heat treatment in accordance with the most preferred embodiments of this invention.

As best shown in FIG. 8, an improved corrosion resistant property can be obtained by either of two methods. In a first heat treating method, the previously treated particles or other conductive particles having plural metallic layers and made by conventional methods, can be treated at high temperature in a non-oxidizing atmosphere such a nitrogen or argon atmosphere at a temperature of at least 300° C. to 600° C. for a period of time sufficient to reach the desired temperature up to several hours and preferably two hours. 530° C. is a preferred temperature which allows complete phase transformation of the aluminum silicon material causing the spheriodization of originally dendritic precipitates in the core material. Longer time periods can be used although they are not found to make any substantial difference.

In a second heat treating method as diagrammatically shown in FIG. 8, the same temperature range, i.e., 300° C. to 600° C. can be used for substantially the same time period but at a high vacuum rather than a gaseous non-oxidizing atmosphere a vacuum of less than 1 Torr as for example $10^{-2}$ Torr can be used. Thus shielding materials of this invention can employ particles treated in accordance with FIG. 7 or further processed in accordance with either method of FIG. 8. Additionally either of the methods of FIG. 8 can be used to heat treat conventional aluminum core conductive metal coated particles where the aluminum core is not an aluminum silicon alloy as for example the particles specifically described in the examples of U.S. Pat. No. 4,507,359.

After the heat treating corrosion resistance steps of FIG. 8 or after the processing of FIG. 7, as desired, the coated particles can be compounded with resins in accordance with this invention to form various structural forms for shielding as known in the art.

The silver plating step of this invention can be any conventional silver plating step including electroplating and electroless silver plating.

The processes of FIG. 8 are believed to act to refine the silver layer causing recrystalization and grain encoarsing to give better larger grain size and better conductivity. In addition the refinement, the aluminum silicon core changes from a dendritic silicon rich precipitate to a more spherical shape with an annealed or refined characteristic which can give better conductivity. Moreover, the heat treating steps of this invention can act to change the silver substrate interface to aid in conductivity and produce improved corrosion resistance characteristics.

The silver or other metallic plating of the aluminum silicon core with its overlying intermediate coating can be carried out by standard methods as previously described. In addition to the above described specific step, aluminum silicon powder can be etched with high concentrations of sodium hydroxide as for example 600 grams of sodium hydroxide in 84 liters of water for 14 kilogram batch. The etch process preferably has two or three rinses between etch steps. A significant amount of aluminum can be removed from the core leaving a silicon rich surface. The etching is important for preprocessing before applying the intermediate layers such as zinc or the other materials of this invention to achieve optimum adhesion of the intermediate layer and to allow controllable chemical reaction in the process.

The intermediate layer when it be tin or zinc can be processed at 50° C. and in an alkaline solution. More than one processing step with zinc or tin can be used. For example the powder can be rinsed three times between separate coating or metalizing steps. The process can use 1,040 grams of sodium stannate for each stannate step for a 13 kilogram batch. An additional 104 grams of potassium sodium tartrate can be used as a buffer complexer. The sodium stannate and buffer are dissolved in water and added over 15 minutes. In zincating solutions containing 336 grams of sodium hydroxide, 84 grams of zinc oxide and 8.4 grams of potassium tartrate with 0.84 grams ferrichloride added over 15 minutes for each zincate step.

In stannating, a considerable amount of free tin is produced in the process. Most of the tin is large particle size and is removed by sifting the final product. Analysis of stannated powder shows 0.3 to 0.7 percent tin. Aluminum silicon powder has been stannated to yield a product which is readily silver plated. Zinc levels between 0.5 and 1 percent have been easily obtained.

Zincated aluminum silicon powder is sensitized by treatment with a solution of sodium thiosulfate and a small amount of amoniated silver nitrate and then silver plated by adding amoniated silver nitrate followed by addition of formaldehyde at 300 ml per minute.

The optimum silver content for a powder with an average particle size of about 60 microns is 16 percent, but with zincated aluminum silicone it is possible to plate at 8 percent silver and obtain a product which shows only slightly increased electrical resistance in a gasket.

The following non limiting examples show particluar preferred embodiments of the present invention.

EXAMPLES

EXAMPLE I

A highly electrically conductive sheet from which the die-cut gasket of FIGS. 1 to 3 is made, or produced is described below. Thirty-three and one-half (33.5) grams of a conventional Dow Corning (Midland, Mich.) silicone gum (resin) e.g. #440 is mill mixed with 3.76 grams of CAB-O-SIL MS7 silica, 0.29 grams of R. T. Vanderbilt Varox (2,5-dimethyl, 2,5-di (t-butylperoxy) hexane. To this mixture on the mill is added 62 grams of particles of aluminum silicon having an intermediate layer of zinc and an outer layer of silver, (powder) 60 microns average size and mixing is continued to homogenuity. The aluminum silicon core particles are of an eutectic alloy of aluminum and silicon and are made as illustrated in FIG. 7 and then heat treated at 530° C. for two hours in a nitrogen atmosphere. The resin particle mixture is sheeted off the mill 62 mils thick and is placed in a mold and molded at 325° F. at 30 ton pressure for 15 minutes. After removal from the mold, the material is post cured at 350° F. for three hours. The volume percent is 37.5 volume percent particles with the gum (resin) being 49.3 volume percent. The gasket is then die-cut from the sheet. Typical volume resistivity of such gasket is 0.002–0.005 ohm-cm.

EXAMPLE II

An electrically conductive adhesive is prepared by mixing 75 parts by weight of silver - zinc - aluminum silicon powder (60 microns average particle size) as described above in a solution of 20 parts by weight of solid polyamide resin (Versalon 1100) 5 parts by weight of liquid polyamide resin (Versamide 125) 25 parts by weight of toluene 25 parts by weight of ethanol.

EXAMPLE III

An electrically conductive caulking is prepared by mixing 288 parts by weight of silver - zinc - aluminum silicon powder (60 microns average particle size) as described above to a solution of
34 parts by weight of toluene
34 parts by weight of ethanol
32 parts by weight of polyamide resin

EXAMPLE IV

When the silver outer layer zinc intermediate layer aluminum silicon core particles are replaced in any of Examples I–III with particles having intermediate layers of tin or nickel advantageous corrosion resistant properties are obtained.

EXAMPLE V

In a corrosion test the gasket material made as in Example I is die-cut and flanged in between aluminum plate. The fixture gasket is then tested following a procedure described as ASTM B117-73 salt fog testing. After 144 hours the test fixture is then washed with warm water. Minimal corrosion is observed showing desirable external corrosion characteristics as compared with conventional gaskets having silver, silver on glass and silver on copper particles. The gasket material does not lose its electrical properties and remains effective as an EMI shield.

I claim:

1. An electrically conductive particle for use as a conductive filler in a resin matrix suitable for electromagnetic shielding use,
   said particle comprising an inner core of an aluminum silicon alloy having from 5 to 20 percent by weight of silicon,
   an intermediate layer of a metal selected from the group consisting of mercury, palladium, copper, chromium, platinum, gold, nickel, tin, zinc and mixtures thereof,
   and an outer layer of a highly electrically conductive metal.

2. A particle in accordance with claim 1 and further comprising said aluminum silicon alloy being an eutectic alloy.

3. An electrically conductive particle in accordance with claim 1 and further comprising said last mentioned highly electrically conductive metal being silver in an amount of from 4 percent to 25 percent by weight of said particle.

4. An electrically conductive particle in accordance with claim 1 wherein said intermediate layer comprises from 0.1 percent to 5 percent by weight of said particle.

5. An electrically conductive particle in accordance with claim 4 wherein said intermediate layer is zinc.

6. An electrically conductive particle in accordance with claim 3 wherein said intermediate layer is tin.

7. An electrically conductive particle in accordance with claim 1 wherein said intermediate layer is zinc.

8. An electromagnetic energy shielding material having a volume resistivity to be effective as an electromagnetic energy shield, said material comprising resin matrix loaded with electrically conductive particles, said particles comprising an aluminum silicon alloy core having a first layer of a material selected from the group consisting of mercury, palladium, copper, chromium, platinum, gold, nickel, tin and zinc,
   and an outer layer of a highly electrically conductive metal overlying said first layer.

9. The shielding material in accordance with claim 8 whereas said particles have an intermediate layer of a metal selected from the group consisting of mercury, palatium, copper, chromium, platinum, gold, nickel, tin, zinc and mixtures thereof.

10. Shielding material in accordance with claim 9 whereas said intermediate layer is zinc.

11. A shielding material in accordance with claim 9 whereas said intermediate layer is tin.

12. A shielding material in accordance with claim 9 whereas said intermedite layer is nickel.

13. A shielding material in accordance with claim 8 whereas said outer layer is silver.

14. A shielding material in accordance with claim 13 wherein said outer layer is silver in an amount of from about 4 percent to about 25 percent by weight of said particle.

15. A shielding material in accordance with claim 8 wherein said aluminum silicon alloy has from about 70 to about 95 percent by weight of aluminum and from about 5 to about 20 percent by weight of silicon.

16. A shielding material in accordance with claim 15 wherein said silicon is present in an amount of from 9 to 14 percent and said alloy is an eutectic alloy.

17. A shielding material in accordance with claim 16 comprising from about 80 to about 50 percent by volume of resin and from about 20 to about 50 percent by volume of said particles.

18. A shielding material in accordance with claim 17 wherein said particles have an average particle size of from about 20 to 75 microns,
   said intermediate layer is present in an amount of from 0.2 to about 10 percent by weight of said particle and said electrically conductive outer layer is present in an amount of from about 4 to about 25 percent by weight of said particle.

* * * * *

UNITED STATES PATENT AND TRADEMARK OFFICE
CERTIFICATE OF CORRECTION

PATENT NO. : 4,678,716
DATED : July 7, 1987
INVENTOR(S) : Wen-Shian V. Tzeng

It is certified that error appears in the above-identified patent and that said Letters Patent is hereby corrected as shown below:

```
Column  1, line  9, please change "Where" to --where--;
Column  1, line 28, please change "inventions" to --invention--;
Column  2, line  5, please change "platium" to --palladium--;
Column  5, line 65, please change "carries" to --carried--;
Column 10, line  9, please change "palatium" to --palladium--.
```

Signed and Sealed this

Twenty-ninth Day of June, 1993

Attest:

MICHAEL K. KIRK

*Attesting Officer*   *Acting Commissioner of Patents and Trademarks*